United States Patent
Abdollahian et al.

(10) Patent No.: US 6,297,696 B1
(45) Date of Patent: Oct. 2, 2001

(54) OPTIMIZED POWER AMPLIFIER

(75) Inventors: Mehdy Abdollahian, Westford, MA (US); James R. Griffiths, Londonderry, NH (US); Theodore L. Tewksbury, Boston, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/593,705

(22) Filed: Jun. 15, 2000

(51) Int. Cl.[7] ........................... H03F 3/28
(52) U.S. Cl. .................. 330/124 R; 330/302; 375/238; 455/126
(58) Field of Search ............... 330/124 R, 302; 375/238; 455/126

(56) References Cited

U.S. PATENT DOCUMENTS

| 3,202,928 | * | 8/1965 | Prior | 330/124 R |
|---|---|---|---|---|
| 3,643,163 | | 2/1972 | Bruck | 325/177 |
| 3,842,358 | | 10/1974 | Frazier | 329/129 |
| 4,070,550 | * | 1/1978 | Miller, Jr. et al. | 179/15 BA |
| 4,187,471 | * | 2/1980 | Shimoji et al. | 330/124 R |
| 4,490,684 | * | 12/1984 | Epsom et al. | 330/124 R |
| 4,656,434 | | 4/1987 | Selin | 330/84 |
| 4,701,716 | * | 10/1987 | Poole | 330/124 R |
| 5,101,171 | * | 3/1992 | Redmond | 330/124 R |
| 5,381,108 | | 1/1995 | Whitmarsh et al. | 330/2 |
| 5,420,536 | | 5/1995 | Faulkner et al. | 330/149 |
| 5,564,086 | | 10/1996 | Cygan et al. | 455/126 |
| 5,644,268 | | 7/1997 | Hang | 330/151 |
| 5,732,333 | | 3/1998 | Cox et al. | 455/126 |
| 5,778,308 | | 7/1998 | Sroka et al. | 455/115 |
| 6,211,734 | * | 4/2001 | Ahn | 330/149 |

FOREIGN PATENT DOCUMENTS

| 58206212 | * | 1/1983 | (JP) . |
|---|---|---|---|
| 3195205 | * | 3/1991 | (JP) . |

* cited by examiner

*Primary Examiner*—Michael B Shingleton
(74) *Attorney, Agent, or Firm*—Connolly Bove Lodge & Hutz LLP

(57) ABSTRACT

Apparatus and method for reducing reflected power in a radio frequency amplifier. A first directional coupler divides the radio frequency signal to first and second quadrature signals. First and second amplifiers amplify each of the quadrature signals. A second directional coupler combines signals from the amplifiers to produce a combined signal. A third directional coupler samples a portion of the reflected power received on the second directional coupler output. A control signal is derived from sampling the reflected power. A variable load impedance connected to the remaining output port of the second directional coupler has an impedance value which changes with respect to a control signal and the impedance is varied so as to substantially match the impedance received by the first output port.

11 Claims, 1 Drawing Sheet

OPTIMIZED POWER AMPLIFIER

BACKGROUND OF THE INVENTION

The present invention relates to power amplifiers which are used in digital wireless telephone applications. Specifically, a power amplifier which has improved reflective power handling capabilities is disclosed.

Portable telephone wireless communication systems employ a battery powered low power radio frequency transmitter circuit coupled to a portable antenna. The usual arrangement includes a telescopic vertical antenna which is fixed to the portable telephone. A problem experienced by the wireless portable telephone is that significant levels of reflected power are experienced due to antenna orientation, and the environment in which the portable telephone is used. The high levels of temporary VSWR seen by the power amplifiers can, besides reducing the effective radiated power, damage the transistors in the final power amplification stages, and, additionally reduce the linearity of the output amplifier. If the reflected power has a constant phase amplitude, due to an unchanging antenna orientation and environment, a matched network could be provided to reduce the reflected power and VSWR. However, the phase and amplitude of the reflected power are constantly changing with the antenna orientation and environment. Accordingly, any attempt to try and match the output amplifier impedance to the antenna impedance must be done dynamically to compensate for the changes in reflected power amplitude and phase.

The present invention has been provided to avoid the consequences of reflected power which continuously changes phase and amplitude.

SUMMARY OF THE INVENTION

A method is disclosed, and a system implementing the method, for reducing reflected power in a radio frequency amplifier. The method and system for implementing the radio frequency amplifier relies upon a balanced amplification of an input signal, wherein the signal to be amplified is split into first and second quadrature related signals. Each of the quadrature related signals are separately amplified in first and second amplifiers, and then recombined in a directional coupler. One of the output ports of the directional coupler is connected to the telephone antenna, while the other port includes a variable load impedance. A sample of the reflected power from the antenna is used to control the variable load impedance so that the port connected to the antenna will be effectively matched to the impedance of the other port, minimizing the amount of reflected power which is transferred by the directional coupler to the connected amplifiers.

DESCRIPTION OF THE PREFERRED EMBODIMENT

Figure 1:
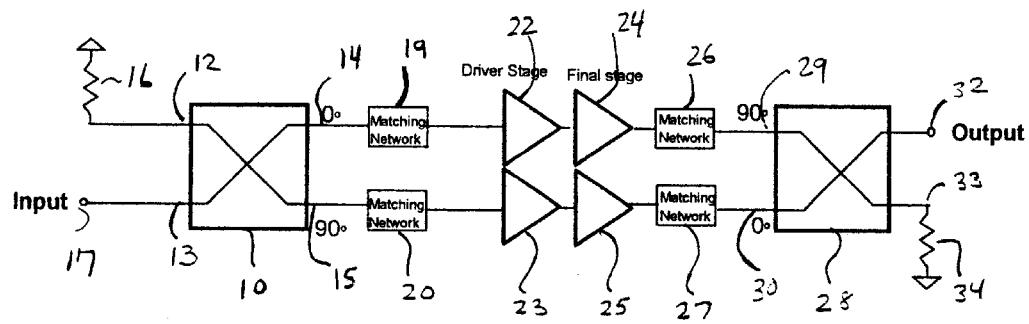
FIG. 1 illustrates a balanced power amplifier having improved VSWR handling characteristics.

Referring now FIG. 1, a power amplification system is shown for providing linear amplification of a modulated radio frequency signal. The radio frequency signal is received on an input 17 which is connected to a hybrid directional coupler 10. As is known in the radio frequency processing art, the hybrid directional coupler 10 produces a split signal through output ports 14 and 15 which are equal in amplitude and in phase quadrature. A load 16 is connected to the remaining input port 12 of the hybrid directional coupler 10 which substantially matches the input impedance seen by the coupler input port 13.

The split quadrature signals are applied to first and second driver amplification stages 22 and 23. In the case of a typical wireless digital telephone application, a first stage of amplification is provided by driver amplifier stages 22 and 23 which provide approximately 15 db of gain to signals received on their respective inputs.

A second, final amplification stage 24 and 25, further amplifies the quadrature related signals to a final output power which may be, for instance, 28 dbm.

Each of the amplification stages, 22, 23, 24 and 25 are transistor amplifiers, which provide for linear amplification of the modulated radio frequency signal. The output amplification stages 24 and 25 are impedance matched via matching networks 26 and 27 to first and second inputs 29 and 30 of a directional coupler 28. The second directional coupler 28 is also a hybrid directional coupler which combines the quadrature input signals so that they are additive, and appear as a combined signal on output port 32. As is known with hybrid directional couplers, when the same signal appears 90° out of phase on input ports 29 and 30, they combined additively at the output port 32 when output ports 32 and 33 see essentially the same impedance. In the foregoing, it is assumed that the antenna impedance which is reflected to the output port 32 is substantially equal to the load impedance 34. When the impedance seen by ports 32 and 33 are matched, essentially the entire power output from final amplification stages 24 and 25 are produced at output port 32.

The foregoing system works well under these matched impedance conditions. However, as is known in the portable radio telephone art, if the antenna of the radio telephone produces any significant reflected power, resulting in a VSWR condition at output terminal 32, then some of that reflected power will emerge on input ports 29 and 30 of the hybrid directional coupler 28. High VSWR conditions due to the poor impedance match between the radio telephone antenna and the output port 32 produce high voltages on the transistors in the final amplification stages 24 and 25. The high VSWR conditions reduce the linearity of the amplification stages 24 and 25, and under extreme conditions, result in breakdown of the output transistors due to high voltages produced from the combination of reflected power and forward power in amplification stages 24 and 25.

Normally, reflected power can be reduced by improving the impedance match between the source producing the reflected power and the device transmitting the power. However, as was noted earlier, in the radio telephone communications art, the reflected power is the result of the orientation of the radio telephone antenna, as well as its environment, which continuously change. Any attempt to provide an optimal impedance match is frustrated by the necessity to rematch the impedances under these different operating conditions.

Figure 2:
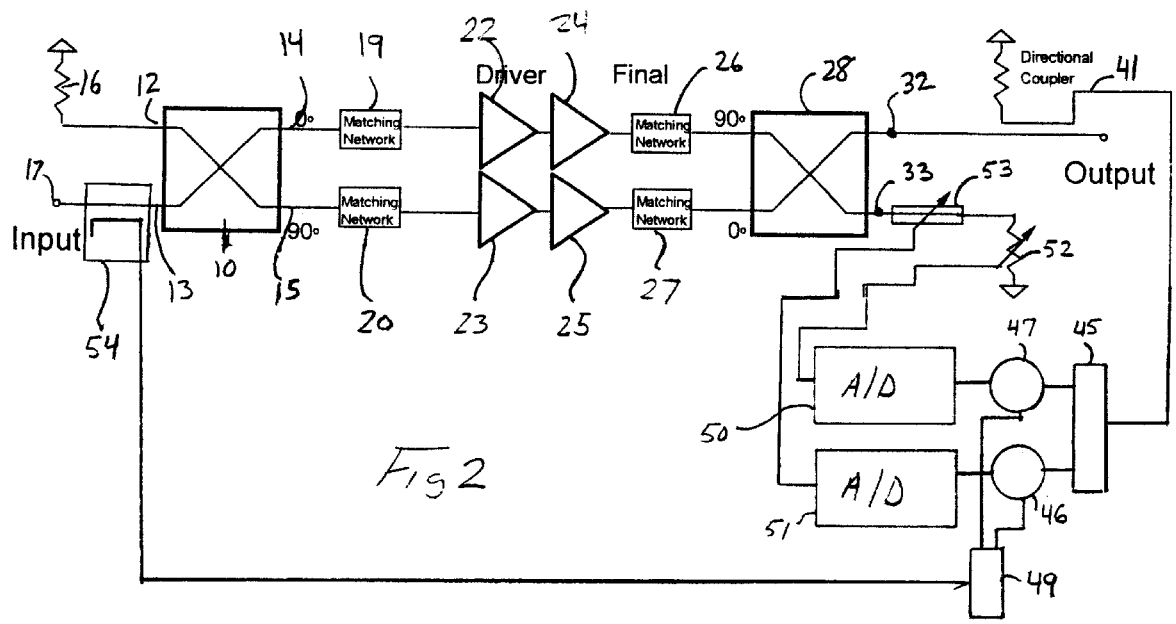
FIG. 2 illustrates an optimized balanced power amplifier in accordance with the preferred embodiment.

An approach for dynamically matching the termination impedance seen by port 32 and port 33 is shown more particularly in FIG. 2. Referring now to FIG. 2, an optimized balanced power amplifier is illustrated. The system of FIG. 2 employs the same components as that of FIG. 1, but includes the ability to change the terminated load on the output port 33, so that the impedance seen by port 33 will be substantially the same as that seen by port 32. As is known from the theory of hybrid directional couplers, when the output impedances on output ports 32 and 33 are matched, all of the power is essentially transferred to output port 32. This impedance matching occurs on a dynamic basis, i.e., as the antenna orientation and environment change. The reflected power directed to port 32 is sensed by a directional coupler 41, and a sample of the reflected power which can be resolved into first and second quantities representing the amplitude and phase of the reflected power is used as a control signal for controlling an impedance on output port 33.

The directional coupler 41 provides a sample of the radio frequency signal reflected through the antenna to a power divider 45. Power divider 45 provides first and second divided signal samples to inputs of product detectors 47 and 46. Product detectors 46 and 47 receive on their reference inputs reference signals which are phase shifted 90° with respect to each other by phase shift circuit 49. The reference signal may be a sample signal obtained from the input of directional coupler 10 via a fourth directional coupler 54.

The output signals from each product detector 46 and 47 represent the sine and cosine of the difference between signals received at the input of each product detector 46 and 47. These outputs represent an in-phase component and a reactive component for the reflected power. The in-phase and reactive reflected power can be compensated by changing the resistive impedance 52 and reactive impedance 53 so that they essentially match the resistive and reactive impedances seen by port 32.

In order to precisely control the amount of resistance and reactance seen by port 33, analog to digital converters 50, 51 may be employed to digitize the output from each of the product detectors 46 and 47. The resolution of the analog to digital converters 50 and 51 may be selected to provide the degree of impedance matching considered necessary in order to reduce the reflected power below a specified amount. The variable resistance of the termination impedance on port 33 may be a pin diode attenuator, having a resistance established by the digital value produced from analog to digital converter 50. Similarly, the variable reactance 53 may be an all pass filter having taps which are selected by the analog to digital converter 51 to provide the correct amount of reactance for reducing the reactive component detected by product detector 46 to zero.

During operation, as the antenna position and environment changes, reflected power will be constantly sampled and resolved into an in-phase and quadrature phase component. Each of these components are digitized and used to adjust the value of a compensating impedance comprising variable resistance 52 and variable reactance 53. In this way, the impedance seen by ports 32 and 33 can be continually matched under various reflective power conditions, which not only reduces the reflective power, but diverts the reflective power away from the power amplification stages of the device.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for reducing reflected power in a radio frequency amplifier comprising:

splitting a radio frequency signal into first and second quadrature related signals;

separately amplifying each of said first and second quadrature related signals;

combining first and second amplified signals with a first directional coupler whereby a combined signal is produced at a first output port of said first directional coupler, and a reflected signal produced from a mismatch of said first output port and a load impedance on said first output port is delivered to a second output port of said coupler;

connecting a variable load impedance connected to said second output port;

locating a second directional coupler connected in series between said first output port and said first output port load impedance for providing a sample of a radio frequency signal being reflected towards said first output port; and controlling said variable load in response to said sample of said radio frequency signal from said directional coupler so that said variable load impedance is varied to minimize the amount of radio frequency signal being reflected towards said variable load.

2. The method of reducing reflected power according to claim 1 wherein said variable load provides a complex reactance having a reactive component and resistive component which are variable.

3. The method of reducing reflected power according to claim 1 wherein said step for controlling generates first and second control signals which represent a difference in impedance between said variable load impedance and said first port load impedance.

4. The method of reducing reflected power according to claim 3 wherein said step for controlling further comprises varying the reactive portion of said variable load impedance with said first control signal and varying a resistive portion of said variable load impedance with said second control signal.

5. The method of reducing reflected power according to claim 4 wherein said first and second control signals are derived from the steps of:

applying said sample of said radio frequency signal to first and second product detectors which have reference inputs which receive first and second quadrature reference signals;

converting output signals produced by said first and second product detectors into first and second digital signals; and controlling the reactance and resistance of said variable load impedance with said first and second digital signals.

6. A radio frequency power amplifier comprising:

a first directional coupler for dividing a radio frequency signal into first and second quadrature signals;

first and second amplifier stages for amplifying each of said first and second quadrature signals;

a second directional coupler connected to receive first and second amplified signals on first and second input ports, said having first and second output ports;

a third directional coupler connected to said second directional coupler first output port and to an antenna load, said third directional coupler providing a sample of radio frequency signals which are reflected from said antenna;

a variable impedance load connected to said second output port, having a control terminal for varying the impedance on said second output port in response to a control signal applied to said control port; and means for providing a control signal to said variable impedance load in response to said sample of radio frequency signals, whereby said variable impedance is varied so that it substantially matches the impedance seen by said first output port.

7. The radio frequency power amplifier according to claim 6 wherein said variable impedance provides a reactance and resistance which are varied in response to said sampled radio frequency signal.

8. The radio frequency power amplifier according to claim 7 wherein said means for providing a control signal comprises:

a sine detector connected to receive said sampled signal and provide a first in phase signal component for controlling said resistance; and a cosine detector connected to receive said sampled signal and provide a second quadrature signal component for controlling said reactance.

9. The radio frequency power amplifier according to claim 8 further comprising:

analog to digital converter means for providing first and second digital control signals from said sine and cosine detectors.

10. The radio frequency power amplifier according to claim 7 wherein said resistive component is a diode.

11. The radio frequency power amplifier according to claim 9 wherein said reactance is a digital filter which provides a phase delay in response to said second digital control signal.

* * * * *